US010353740B2

(12) United States Patent
Vairavanathan et al.

(10) Patent No.: US 10,353,740 B2
(45) Date of Patent: Jul. 16, 2019

(54) EFFICIENT RECOVERY OF ERASURE CODED DATA

(71) Applicant: NetApp, Inc., Sunnyvale, CA (US)

(72) Inventors: Emalayan Vairavanathan, Vancouver (CA); Dheeraj Raghavender Sangamkar, Vancouver (CA); Song Guen Yoon, Coquitlam (CA); Yi Zhang, Vancouver (CA)

(73) Assignee: NETAPP, INC., Sunnyvale, CA (US)

( * ) Notice: Subject to any disclaimer, the term of this patent is extended or adjusted under 35 U.S.C. 154(b) by 0 days.

(21) Appl. No.: 15/589,909

(22) Filed: May 8, 2017

(65) Prior Publication Data

US 2017/0242732 A1  Aug. 24, 2017

Related U.S. Application Data

(63) Continuation-in-part of application No. 14/696,001, filed on Apr. 24, 2015, now Pat. No. 9,921,910.

(30) Foreign Application Priority Data

Feb. 19, 2015 (IN) .............................. 796/CHE/2015

(51) Int. Cl.
*G06F 9/50* (2006.01)
*G06F 11/20* (2006.01)
(Continued)

(52) U.S. Cl.
CPC ............ *G06F 9/5038* (2013.01); *G06F 3/064* (2013.01); *G06F 3/067* (2013.01); *G06F 3/0619* (2013.01);
(Continued)

(58) Field of Classification Search
CPC ...... G06F 9/5038; G06F 3/0619; G06F 3/064; G06F 3/067; G06F 11/1076;
(Continued)

(56) References Cited

U.S. PATENT DOCUMENTS 8,315,999 B2 * 11/2012 Chatley ................. G06F 3/0613
707/600
8,484,536 B1  7/2013 Cypher
(Continued)

OTHER PUBLICATIONS

Mager, Design and Implementation of a Distributed Back-up System, May 26, 2014, Ecole Doctorale Informatique, Telecommunication et Electronique, Paris, pp. 1-159.*

*Primary Examiner* — John J Tabone, Jr.
(74) *Attorney, Agent, or Firm* — Haynes and Boone, LLP

(57) ABSTRACT

To efficiently recover from a multiple storage node failure, a storage node concurrently restores data fragments to the multiple failed storage nodes, as opposed to restoring each node individually. In the VCS based storage technique, storage nodes are restored as part of an ECG repair process. For each ECG being repaired, a storage node performing the restoration process reads data fragments from active nodes in the ECG and generates new data fragments to replace any lost data fragments. The node then stores one of the new data fragments across each of the failed storage nodes. By concurrently restoring data fragments to each failed storage node, the data fragments needed to repair each ECG are only read once, thereby preserving disk operations and network bandwidth.

20 Claims, 14 Drawing Sheets

(51) Int. Cl.
*G06F 11/10* (2006.01)
*G06F 3/06* (2006.01)
*H04L 29/08* (2006.01)
*H04L 29/14* (2006.01)

(52) U.S. Cl.
CPC ...... *G06F 11/1076* (2013.01); *G06F 11/2069* (2013.01); *H04L 67/1097* (2013.01); *H04L 69/40* (2013.01); *G06F 11/20* (2013.01); *G06F 2201/805* (2013.01); *G06F 2201/85* (2013.01)

(58) Field of Classification Search
CPC ................ G06F 11/2069; G06F 11/20; G06F 2201/805; G06F 2201/85; H04L 67/1097; H04L 69/40
USPC ................ 714/764, 770, 773, 6.2; 711/114; 709/223
See application file for complete search history.

(56) References Cited

U.S. PATENT DOCUMENTS

| | | | |
|---|---|---|---|
| 8,832,234 B1 | 9/2014 | Brooker et al. | |
| 8,856,619 B1 | 10/2014 | Cypher | |
| 8,972,478 B1 | 3/2015 | Storer et al. | |
| 9,032,061 B1 | 5/2015 | Xin et al. | |
| 9,092,441 B1* | 7/2015 | Patiejunas | G06F 17/30221 |
| 9,213,709 B2* | 12/2015 | Patiejunas | G06F 17/30371 |
| 9,354,683 B2* | 5/2016 | Patiejunas | G06F 1/266 |
| 9,594,632 B2* | 3/2017 | Luby | G06F 11/1076 |
| 9,740,403 B2 | 8/2017 | Storer et al. | |
| 9,767,129 B2* | 9/2017 | Patiejunas | G06F 17/30377 |
| 9,779,035 B1* | 10/2017 | Patiejunas | G06F 13/00 |
| 9,785,498 B2 | 10/2017 | Misra et al. | |
| 9,817,715 B2* | 11/2017 | Slik | G06F 11/1076 |
| 9,830,111 B1* | 11/2017 | Patiejunas | G06F 3/0625 |
| 9,880,753 B2* | 1/2018 | Sawicki | G06F 3/0607 |
| 9,921,910 B2* | 3/2018 | Sangamkar | G06F 11/1076 |
| 2007/0214314 A1* | 9/2007 | Reuter | G06F 3/0607 |
| | | | 711/114 |
| 2009/0132543 A1* | 5/2009 | Chatley | G06F 3/0613 |
| 2009/0210452 A1* | 8/2009 | Ishii | G06F 3/0607 |
| 2010/0180266 A1 | 7/2010 | Hiniker | |
| 2010/0241793 A1 | 9/2010 | Sugimoto et al. | |
| 2011/0179100 A1 | 7/2011 | Kawai | |
| 2011/0191536 A1 | 8/2011 | Mizuno et al. | |
| 2012/0131025 A1 | 5/2012 | Cheung et al. | |
| 2012/0166487 A1* | 6/2012 | Stougie | G06F 11/1076 |
| | | | 707/792 |
| 2012/0310892 A1* | 12/2012 | Dam | G06F 17/30156 |
| | | | 707/659 |
| 2013/0103945 A1 | 4/2013 | Cannon et al. | |
| 2013/0145105 A1* | 6/2013 | Sawicki | G06F 3/0619 |
| | | | 711/147 |
| 2013/0151653 A1* | 6/2013 | Sawicki | G06F 15/17331 |
| | | | 709/216 |
| 2013/0275815 A1* | 10/2013 | De Keyser | G06F 11/30 |
| | | | 714/47.2 |
| 2014/0013322 A1 | 1/2014 | Freimuth et al. | |
| 2014/0052706 A1 | 2/2014 | Misra et al. | |
| 2014/0164694 A1* | 6/2014 | Storer | G06F 11/1092 |
| | | | 711/114 |
| 2014/0325507 A1 | 10/2014 | Freimuth et al. | |
| 2015/0163206 A1* | 6/2015 | McCarthy | G06F 21/6227 |
| | | | 713/171 |
| 2015/0324123 A1 | 11/2015 | Storer et al. | |
| 2016/0011935 A1* | 1/2016 | Luby | G06F 3/0617 |
| | | | 714/6.2 |
| 2016/0011936 A1* | 1/2016 | Luby | G06F 3/0617 |
| | | | 714/6.2 |
| 2016/0011939 A1* | 1/2016 | Luby | G06F 11/1076 |
| | | | 714/764 |
| 2016/0019159 A1 | 1/2016 | Ueda et al. | |
| 2016/0085651 A1* | 3/2016 | Factor | H04L 67/1097 |
| | | | 714/6.2 |
| 2016/0085652 A1* | 3/2016 | Factor | H04L 67/1097 |
| | | | 714/6.2 |
| 2016/0246512 A1* | 8/2016 | Li | G06F 17/30289 |
| 2016/0246677 A1 | 8/2016 | Sangamkar et al. | |
| 2016/0313916 A1 | 10/2016 | Sivananainthaperumal et al. | |
| 2016/0314043 A1* | 10/2016 | Slik | G06F 11/1076 |
| 2017/0010944 A1 | 1/2017 | Saito et al. | |
| 2017/0228409 A1* | 8/2017 | Darcy | G06F 17/30368 |
| 2017/0228412 A1* | 8/2017 | Agarwal | G06F 17/30371 |
| 2017/0242732 A1* | 8/2017 | Vairavanathan | G06F 9/5038 |
| 2017/0242770 A1* | 8/2017 | Sangamkar | H04L 67/1097 |
| 2017/0286445 A1* | 10/2017 | Gowdappa | G06F 17/30171 |
| 2018/0095855 A1* | 4/2018 | Sanakkayala | G06F 9/45558 |
| 2018/0150536 A1* | 5/2018 | Lai | G06F 17/30575 |
| 2018/0165155 A1* | 6/2018 | Sangamkar | G06F 11/1076 |

* cited by examiner

Virtual Chunk Space Terminology

- ChunkService == Storage Node
  - One per Storage Node
  - Stores chunks/fragments
- Virtual Chunk Spaces (VCS)
  - ChunkService is split into multiple VCSs
  - Resides only in a single storage volume (RangeDB)
  - Unit of failure
- EC Group
  - Set of VCSs form a Storage Pool as defined by an EC Profile
  - An EC Group stores all stripes of a given object

*FIG. 2B*

| Chunk Service | SN 1 | SN 2 | SN 3 | SN 4 | SN 5 | SN 6 |
|---|---|---|---|---|---|---|
| EC Group 1 | D | | D | | P | |
| EC Group 2 | D | | D | | | P |
| ... | | | | | | |
| EC Group n-1 | P | | | D | | D |
| EC Group n | | P | | D | | D |
| Site | A | | B | | | C |

EFFICIENT RECOVERY OF ERASURE CODED DATA

PRIORITY CLAIM

This application claims priority to U.S. patent application Ser. No. 14/696,001, filed on Apr. 24, 2015, entitled "Virtual Chunk Service Based Data Recovery in A Distributed Data Storage System," which is incorporated herein by reference in its entirety.

BACKGROUND

Several of the disclosed embodiments relate to distributed data storage services, and more particularly, to storing data in a distributed data storage system using virtual chunk services.

In distributed data storage systems, various methods can be used to store data in a distributed manner, e.g., to improve data reliability, protection. Erasure coding is one such method of data protection in which a data object is broken into fragments, encoded with parity information and stored across a set of different storage nodes in the distributed data storage system. When a data object is erasure coded, the distributed data storage system has to typically store the storage information in its metadata. This metadata can include identities of the storage nodes that store each fragment of the encoded data object. When a storage node in the distributed data storage system fails, all the objects that were stored in that storage node have to be discovered and repaired, so that the reliability is not compromised.

For recovering the lost data, the distributed data storage system may have to go through the metadata of all the data objects to identify the data objects impacted by the failed node. Then alternate nodes are selected to move the fragments. After the fragments are moved, the metadata of each moved object should be updated to reflect the new set of storage nodes that the fragments of the objects are stored in. This approach can be resource intensive and can have the following performance bottlenecks: (a) metadata query for each object to find if it is impacted and (b) metadata update for each impacted object after repair due to node or volume loss. This can be a resource intensive process as the distributed data storage system can have a significantly large number of data objects, e.g., billions of data objects. Further, reading such significantly large number of data objects to identify a subset of them that are stored on the failed node, which can be a small the fraction of entire number of data objects is inefficient. In a system with billions of data objects, with each node storing millions of fragments, both these can cause serious performance issues for the recovery process.

BRIEF DESCRIPTION OF THE DRAWINGS

Aspects of the disclosure may be better understood by referencing the accompanying drawings.

FIG. 2B is an example describing various layers of the VCS layout.

FIG. 7 is a table of storage nodes and erasure coding groups showing data fragments of different objects stored at different storage nodes, consistent with various embodiments.

DESCRIPTION

Introduction

Figure 1:
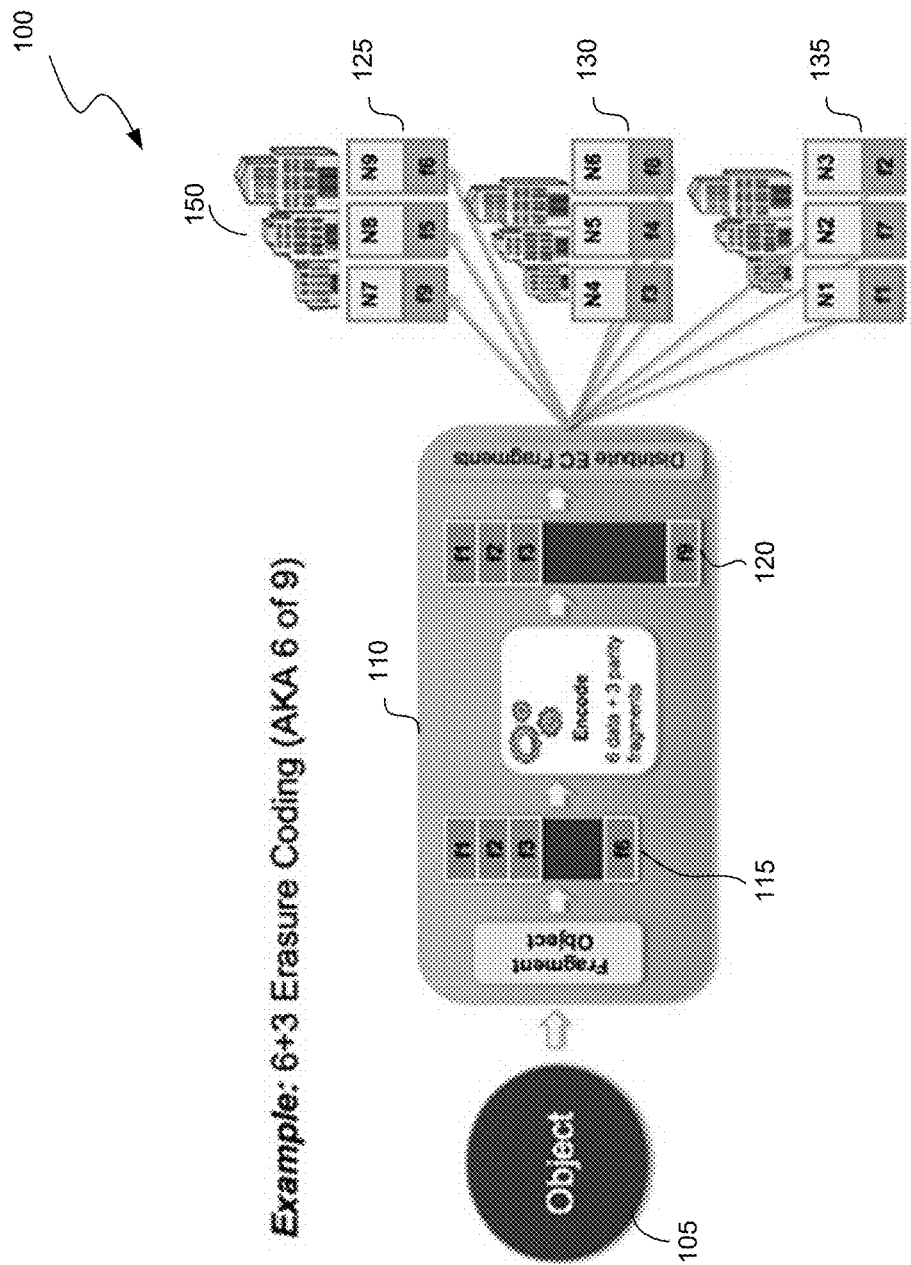
FIG. 1 is a block diagram illustrating an environment in which the disclosed embodiments can be implemented.

Technology is disclosed for virtual chunk service (VCS) based data storage in a distributed data storage system ("the technology"). The VCS based storage technique can improve efficiency in data storage and retrieval in the distributed data storage system ("distributed storage") while also facilitating data protection mechanisms. For example, the VCS based storage technique can be used in conjunction with an erasure coding method, which is typically an encoding scheme used for providing data protection and/or reliability. The VCS based storage technique, when used with the erasure coding method, can improve the efficiency in data recovery, e.g., by minimizing the computing resources used for recovering the lost data.

In the VCS based storage technique, a storage node ("node"), which is a computing device that facilitates storage of data in a persistent storage medium, is split into multiple VCSs and each of the VCSs can be assigned a unique ID in the distributed storage. A VCS is the smallest unit of a failure domain within a chunk service of the node. The unique ID of the VCS does not change during its lifetime. A set of VCSs from a set of nodes form a data storage group ("storage group"), which also can be assigned a unique ID in the distributed storage. When a data object is received for storage in the distributed storage, a storage group can be identified for the data object, the data object can be fragmented into multiple fragments and each fragment can be stored in a VCS of the identified storage group. For example, if a data object is stored using erasure coding method, the VCS based storage technique creates an erasure coding group ("ECG") as a storage group and associates a set of VCSs from a set of nodes with the ECG. When a data object is received for storage, the data object is erasure coded into multiple fragments and each fragment is stored in a VCS of the selected ECG. ECGs are managed by a storage node acting as an erasure coding group manager ("ECGM"). In general, an ECGM manages storage space for erasure coded data which can involve performing various functions such as managing a total number of ECGs, creating new ECGs, marking existing ECGs as full, monitoring the health of ECGs, etc.

In instances of multiple storage node failures, the data fragments lost on each storage node need to be recovered to repair any effected ECGs. Some storage systems can only repair a single storage node at a time. This approach to restoration consumes more disk resources and network bandwidth as the same data fragments might be read multiple times as each node is restored. For example, six erasure coded data fragments may be read from active storage nodes and used to generate a lost data fragment for a first failed storage node. The same six data fragments may later be read again to generate a lost data fragment for a second failed storage node, resulting in twice as many reads.

Overview

To efficiently recover from a multiple storage node failure, a storage node concurrently restores data fragments to the multiple failed storage nodes, as opposed to restoring each node individually. In the VCS based storage technique, storage nodes are restored as part of an ECG repair process. For each ECG being repaired, a storage node performing the restoration process reads data fragments from active nodes in the ECG and generates new data fragments to replace any lost data fragments. The node then stores one of the new data fragments across each of the failed storage nodes. By concurrently restoring data fragments to each failed storage node, the data fragments needed to repair each ECG are only read once, thereby preserving disk operations and network bandwidth.

Example Illustrations

FIG. 1 is a block diagram illustrating an environment 100 in which the disclosed embodiments can be implemented. The environment 100 includes a data management system 110 that provides data storage services, e.g., writing a data object to the distributed storage 150 and reading a data object from the distributed storage 150. The distributed storage 150 can include multiple storage nodes, e.g., nodes "N1"-"N9." Each storage node can be associated with one or more persistent storage devices to store the data object. In some embodiments, the persistent storage device can include storage media such as hard disk drives, magnetic tapes, optical disks such as CD-ROM or DVD-based storage, magneto-optical (MO) storage, flash-based storage devices such as solid state drives (SSDs), or any other type of non-volatile storage devices suitable for storing large quantities of data. The nodes can be distributed geographically. For example, a set of nodes "N1"-"N3" can be in a first location 135, "N4"-"N6" can be in a second location 130 and "N7"-"N9" can be in a third location 125. Further, different locations can have different number of nodes.

In some embodiments, the above described VCS based storage technique can be implemented using the data management system 110. Further, the VCS based storage technique can be implemented in association with the erasure coding method of storing the data. In some embodiments, the erasure coding method involves transforming a set of "k" fragments 115 of a data object, e.g., data object 105, into "n" erasure coded ("EC") fragments 120 by adding "m" parity fragments, where "n=k+m" (thus referred to as "k+m" erasure coding scheme). Some examples of "k+m" erasure coding scheme include "2+1", "6+3" and "8+2" erasure coding schemes. The data object 105 can be regenerated using a subset of the EC fragments 120. The "n" number of data fragments is spread across different nodes in a site and/or across sites. After the EC fragments 120 are generated, the EC fragments 120 are distributed to separate storage nodes for storage.

The data management system 110 enables implementing the VCS based storage technique in association with the erasure coding method. The data management system 110 organizes the distributed storage 150 into multiple logical layers, e.g., an ECG, one or more VCSs that belong to a specified ECG, and stores the EC fragments in a set of nodes having a set of VCSs of the specified ECG. Such storage of the data object enables data to be written, read and recovered in an event of data loss efficiently. In some embodiments, after a data object is stored in the distributed storage 150, the data management system generates various metadata. The metadata can include a mapping of the VCS to a storage node, which identifies a storage node a specified VCS belongs to or is hosted on. The metadata can also include a mapping of the ECG to the VCSs, which identifies a list of specified VCSs associated with an ECG. The metadata can also include a mapping of the VCS to data objects, which indicates the data objects (whose data fragments are) stored in a VCS. In some embodiments, the metadata service can also maintain a mapping of the ECGs to the data objects, which indicates the data objects stored in an ECG.

Figure 2A:
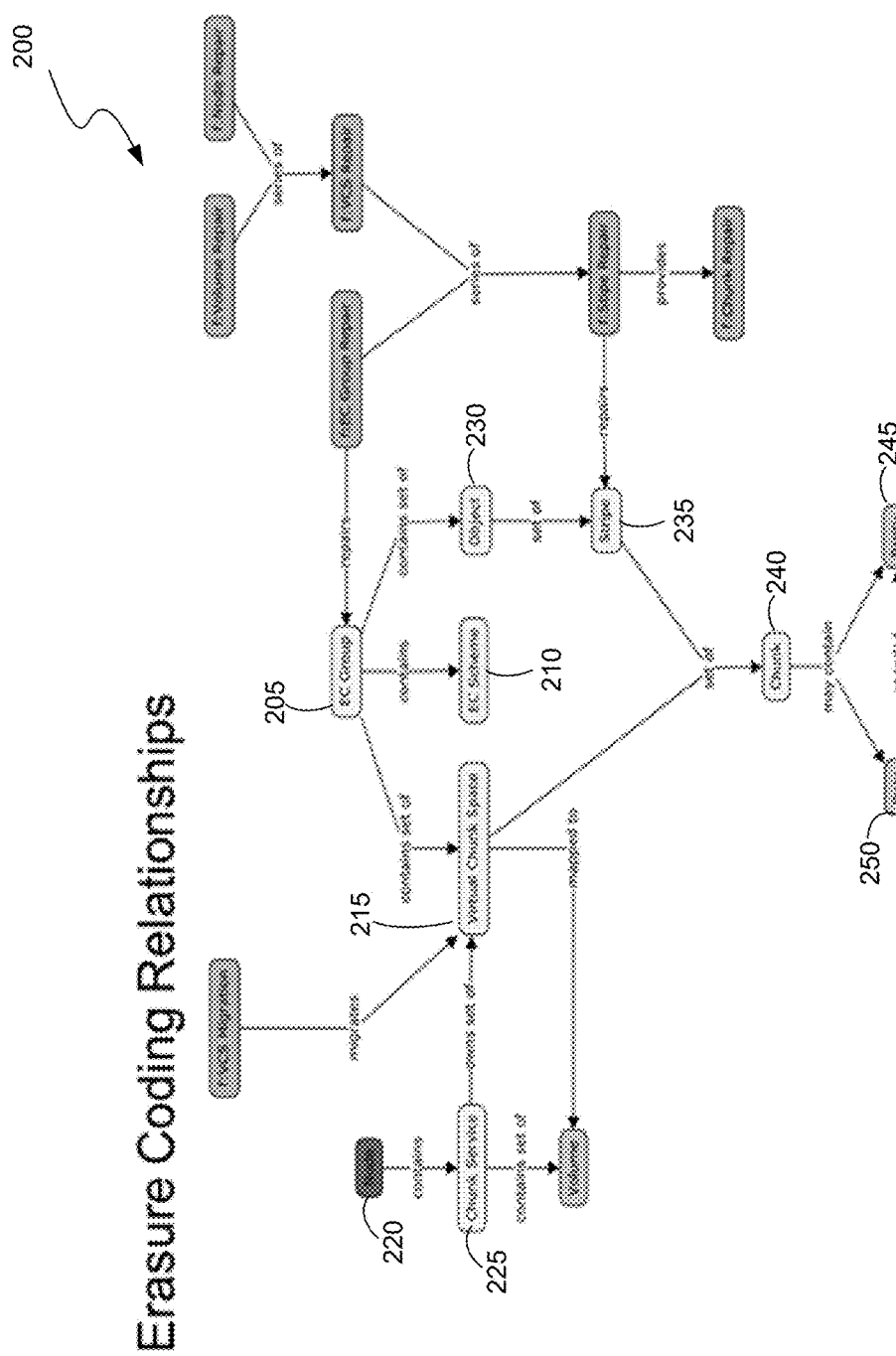
FIG. 2A is a block diagram illustrating a virtual chunk service (VCS) layout of a distributed storage of FIG. 1, consistent with various embodiments.

FIG. 2A is a block diagram illustrating a VCS layout of a distributed storage of FIG. 1, consistent with various embodiments. FIG. 2B is an example describing various layers of the VCS layout 200. A node can include or be considered as a chunk service, which can store a number of data chunks or fragments. The chunk service can be logically split into a specified number of VCSs. A VCS is the smallest unit of a failure domain within the chunk service and will have a unique identification (ID) which never changes during its lifetime. A set of VCSs spanning multiple storage nodes form an ECG. The size of a VCS can be determined in various ways, e.g., as a function of the erasure coding method used, number of storage nodes in the distributed storage 150, typical size of data objects stored in the distributed storage 150, etc. The number of VCSs in a storage node can also be determined in various ways, e.g., storage capacity of a storage node, storage capacity of the distributed storage 150, number of storage nodes.

Referring to FIG. 2A, the VCS layout 200 describes the layers in detail. The node 220 contains a chunk service 225. In some embodiments, the node 220 can be similar to one of the storage nodes in the distributed storage 150 of FIG. 1. The chunk service 225 on the node 220 can contain a set of VCSs 215. An ECG 205 can contain a set of VCSs, such as VCSs 215, spanning multiple nodes. For example, a first ECG contains a VCS each from node "N1," "N4" and "N5." Different ECGs can be formed based on a grouping profile or scheme 210. That is, the set of VCSs for a specified ECG can be selected from a specified set of nodes based on the grouping scheme 210. Further, the number of VCSs in the ECG can also be selected based on the grouping scheme 210. For example, the grouping scheme 210 can indicate that for a data object, e.g., data object 230, that is erasure coded using a "2+1" erasure coding scheme, an ECG should have three VCSs, one each from one of the nodes from a first location 135, a second location 130 and the third location 125. For example, the ECG contains a VCS each from node "N1," "N4" and "N5." In another example, if the erasure coding scheme used to store the data object is 230, is "6+3"

erasure coding scheme, then the grouping scheme 210 can indicate that the ECG should have "9" VCSs, one from each of the nodes "N1"-"N9."

The data object can split into a number of slices or stripes 235, each stripe having a specified number of data fragments that is determined based on the erasure coding scheme. For example, in a "2+1" erasure coding, the stripe width is three, which means each stripe of the data object has "3" fragments 240, out of which "2" fragments are data fragments 250 and "1" fragment is a parity fragment 245. After the data object is erasure coded, the EC fragments of the data object 230 are stored in separate VCSs of the ECG group to which the data object is assigned, e.g., based on the grouping scheme 210.

Figure 3:
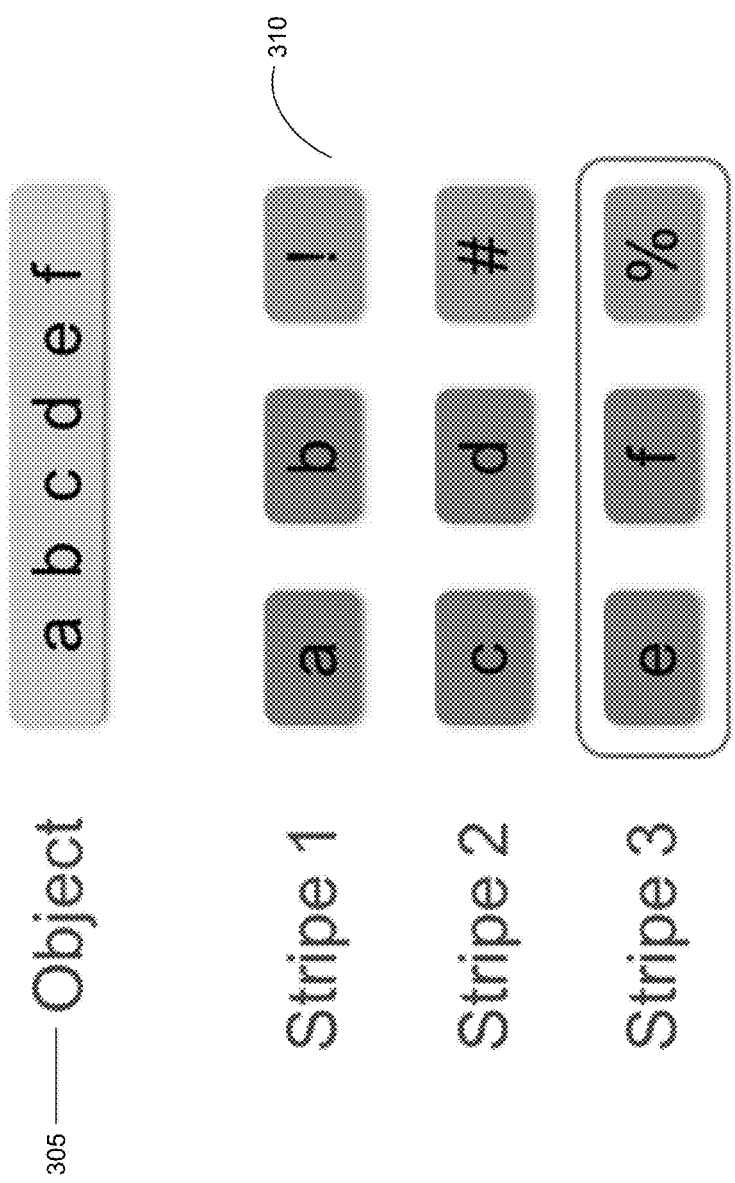
FIG. 3 is a block diagram of a process for erasure coding a data object using a "2+1" erasure coding scheme, consistent with various embodiments.

FIG. 3 is a block diagram of a process for erasure coding a data object using a "2+1" erasure coding scheme 300, consistent with various embodiments. In some embodiments, the data object 305 can be similar to the data object 105 of FIG. 1. The data object 305 can include "6" bytes of data. The data object 305 can be erasure coded using "2+1" erasure coding scheme. In some embodiments, "2+1" means "2" data and "1" parity fragments in a stripe. Using a 1 Byte fragment size, the data object 305 can be split into "3" stripes and "9" EC fragments 310 as illustrated. In the "2+1" scheme, 2 bytes/fragments are considered at a time and a third byte/fragment is added as parity to generate a stripe.

The EC fragments 310 can then be stored in VCSs of an ECG that can span multiple nodes, which can be situated in different geographical locations. In some embodiments, the EC fragments 310 can be similar to the EC fragments 120 of FIG. 1.

Figure 4:
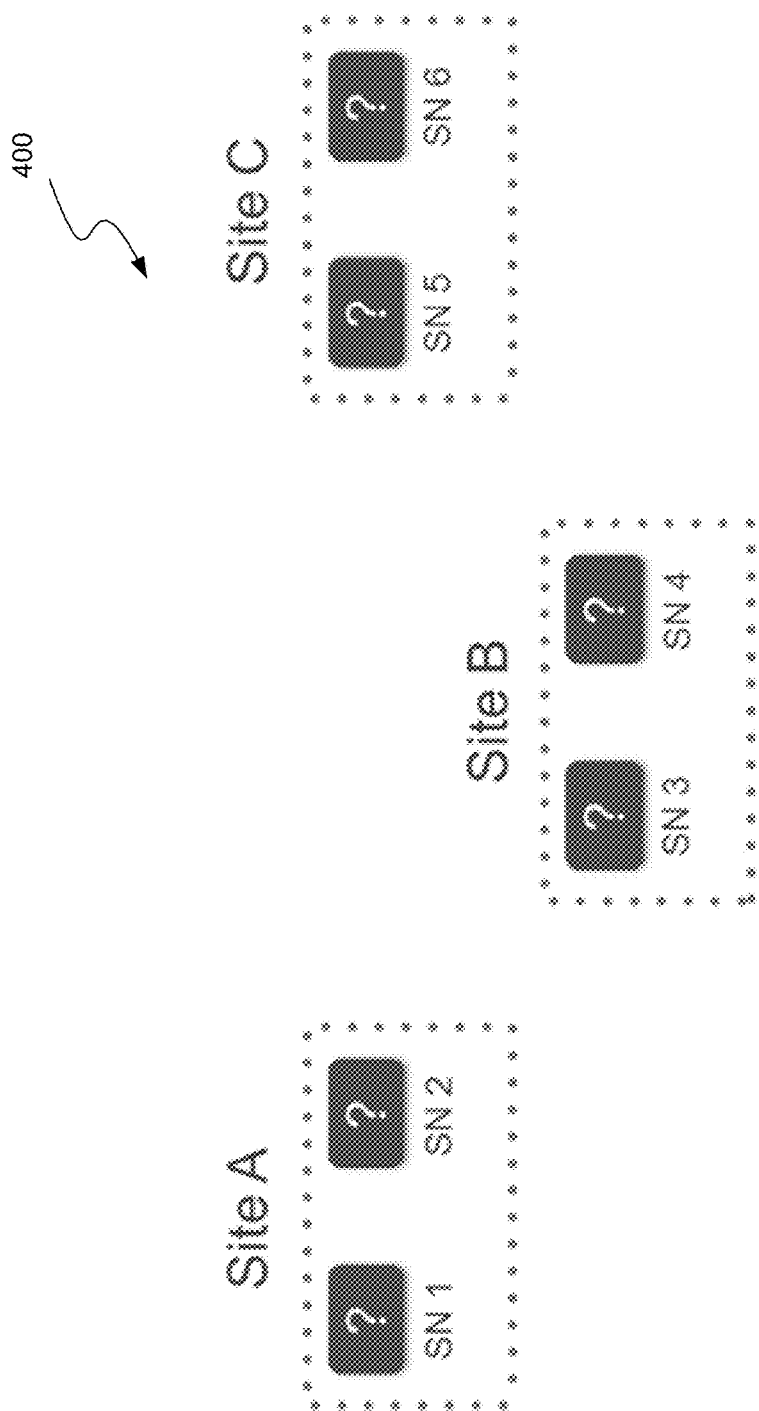
FIG. 4 is a block diagram illustrating an arrangement of storage nodes of a distributed storage system at various sites, consistent with various embodiments.

FIG. 4 is a block diagram illustrating arrangement 400 of nodes at various sites, consistent with various embodiments. In the arrangement 400, "6" nodes are located at various sites. For example, storage nodes "SN1" and "SN2" are located at site A, storage nodes "SN3" and "SN4" are located at site B, and storage nodes "SN5" and "SN6" are located at site C. A data management system, e.g., the data management system 110 of FIG. 1, can generate various ECGs that spread across various storage nodes in the arrangement 400, e.g., based on a grouping scheme.

Figure 5:
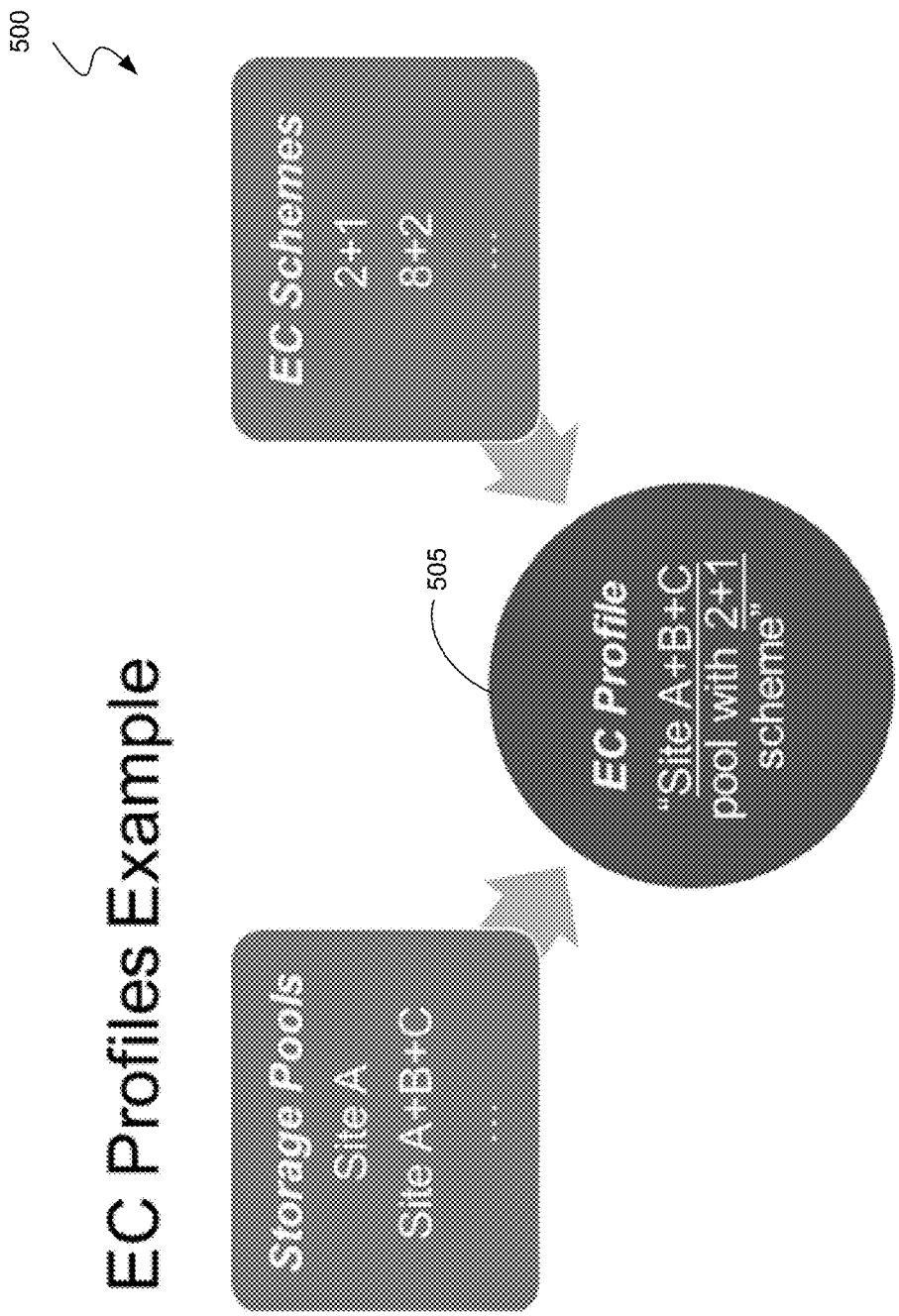
FIG. 5 is a block diagram illustrating an example grouping scheme, consistent with various embodiments.

FIG. 5 is a block diagram 500 illustrating an example grouping scheme 505, consistent with various embodiments. In some embodiments, the grouping scheme 505 can select the sites and the number of storage nodes based on the erasure coding scheme used. The data management system 110 can define a number of grouping schemes. For example, the data management system 110 can define a grouping scheme 505 that forms a storage pool by selecting a storage node from each of the sites A, B and C and to store data objects that are erasure coded using "2+1" erasure coding scheme. The data management system 110 can generate various ECGs per grouping scheme 505. Note that the "2+1" erasure coding scheme 300 is described for illustration purposes. The data object 305 can be erasure coded using other "k+m" erasure coding schemes.

Figure 6:
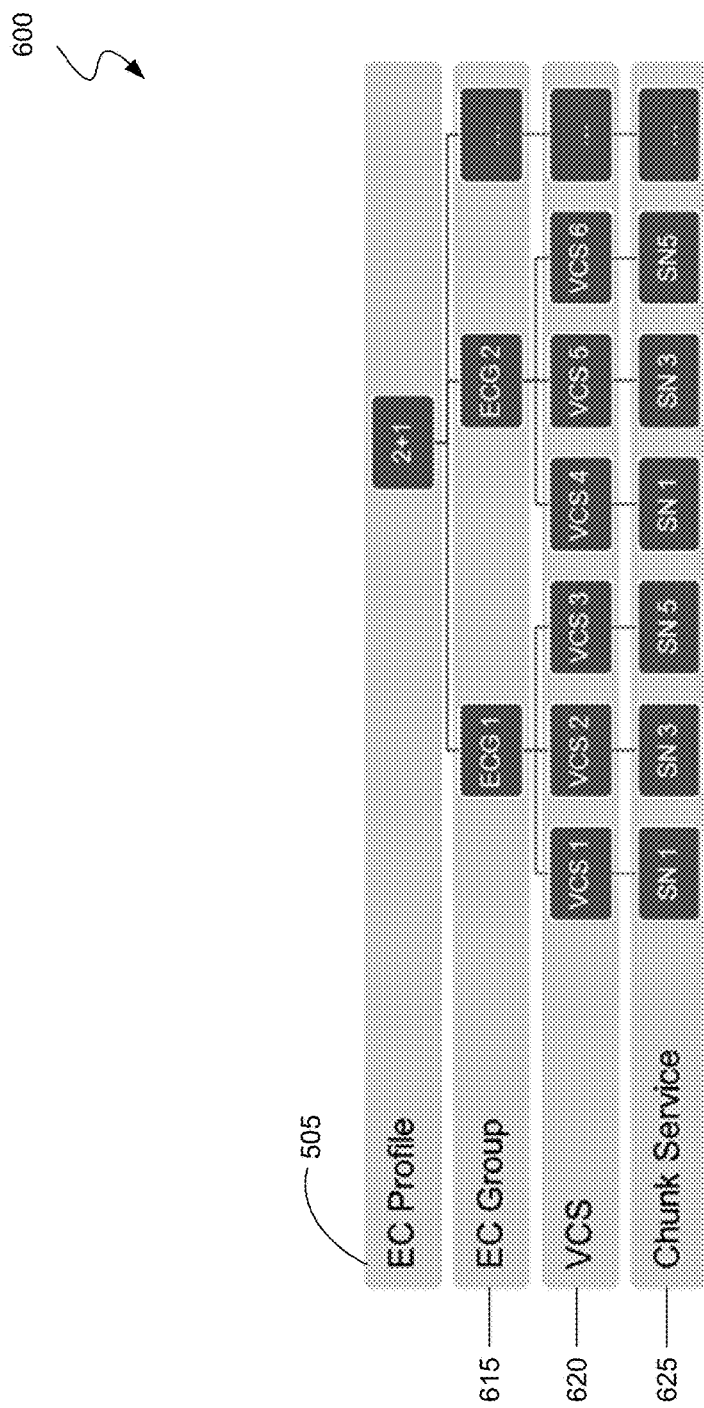
FIG. 6 is a block diagram illustrating an example of the VCS storage layout for storing data objects encoded using "2+1" erasure coding scheme, consistent with various embodiments.

FIG. 6 is a block diagram illustrating an example 600 of the VCS storage layout for storing data objects encoded using "2+1" erasure coding scheme, consistent with various embodiments. In the example 600, for the grouping scheme 505, the data management system 110 has generated a number of ECGs 610, e.g., "ECG 1" and "ECG 2." Further, "ECG 1" is allocated "3" VCSs 620 required for a "2+1" erasure coding scheme, e.g., "VCS 1," "VCS 2," and "VCS 3" from storage nodes 625 "SN1", "SN3" and "SN5," respectively. Note that the VCSs 620 for "ECG 1" are from storage nodes 625 at different sites, per the grouping scheme 505. Similarly, "ECG 2" is allocated "3" VCSs, e.g., "VCS 4," "VCS 5," and "VCS 6" from storage nodes "SN1", "SN3" and "SN5," respectively. The storage nodes 625 can be similar to one or more of the storage nodes in the arrangement 400 of FIG. 4.

After the VCS storage layout is determined, the data management system 110 can generate various mappings, e.g., as metadata. The metadata can include a mapping of the VCS to a storage node, which identifies a storage node a specified VCS belongs to. For example, referring to the VCS storage layout of example 600, the VCS→node mapping for storage node "SN 1" can include "SN 1→VCS 1, VCS 4 . . ." or "VCS 1→SN 1" "VCS 4→SN 1" etc. The metadata can also include a mapping of the ECG to the VCSs, which identifies a list of specified VCSs associated with an ECG. For example, referring to example 600, the ECG→VCS mapping for "ECG 1" can include "ECG 1→VCS 1, VCS 2, VCS 3."

The data management system 110 assigns a data object to a particular ECG, and stores all stripes of the data object in the same ECG. However, each fragment is stored in a separate VCS of the ECG. For example, referring to the data object 305 of FIG. 3, if the data object 305 is assigned to "ECG 1," then each fragment of a stripe is stored in a separate VCS—data fragment "a" in "VCS 1," data fragment "b" in "VCS 2," and data fragment "!" in "VCS 3." All other stripes of the data object 305 can be stored in "ECG 1" similarly.

The data management system 110 can also generate metadata for the data storage object, which indicates the list of objects or fragments of the object in a specified VCS. For example, if data objects "Obj 1," "Obj 2," "Obj 3," and "Obj 4" are stored in the VCSs of "ECG 1," then a VCS→Obj mapping can include "VCS 1→Obj 1, Obj 2, Obj 3, Obj 4". In some embodiments, the metadata service can also maintain a mapping of the data objects to the ECGs, which identifies an ECG in which a specified data object is stored. Continuing with the above example of storing data objects "Obj 1"-"Obj 4" in "ECG 1," an ECG→Obj mapping can include "ECG 1→Obj 1, Obj 2, Obj 3, Obj 4".

FIG. 7 is a table 700 of storage nodes and ECGs showing data fragments of different objects stored at different storage nodes, consistent with various embodiments. In the table 700, various ECGs are assigned VCSs from various storage nodes. For example, "EC Group 1" is allocated "3" VCSs, e.g., from storage nodes "SN1", "SN3" and "SN5," respectively. Similarly, "EC Group 2" is allocated "3" VCSs, e.g., from storage nodes "SN1", "SN3" and "SN6" respectively.

Figure 8:
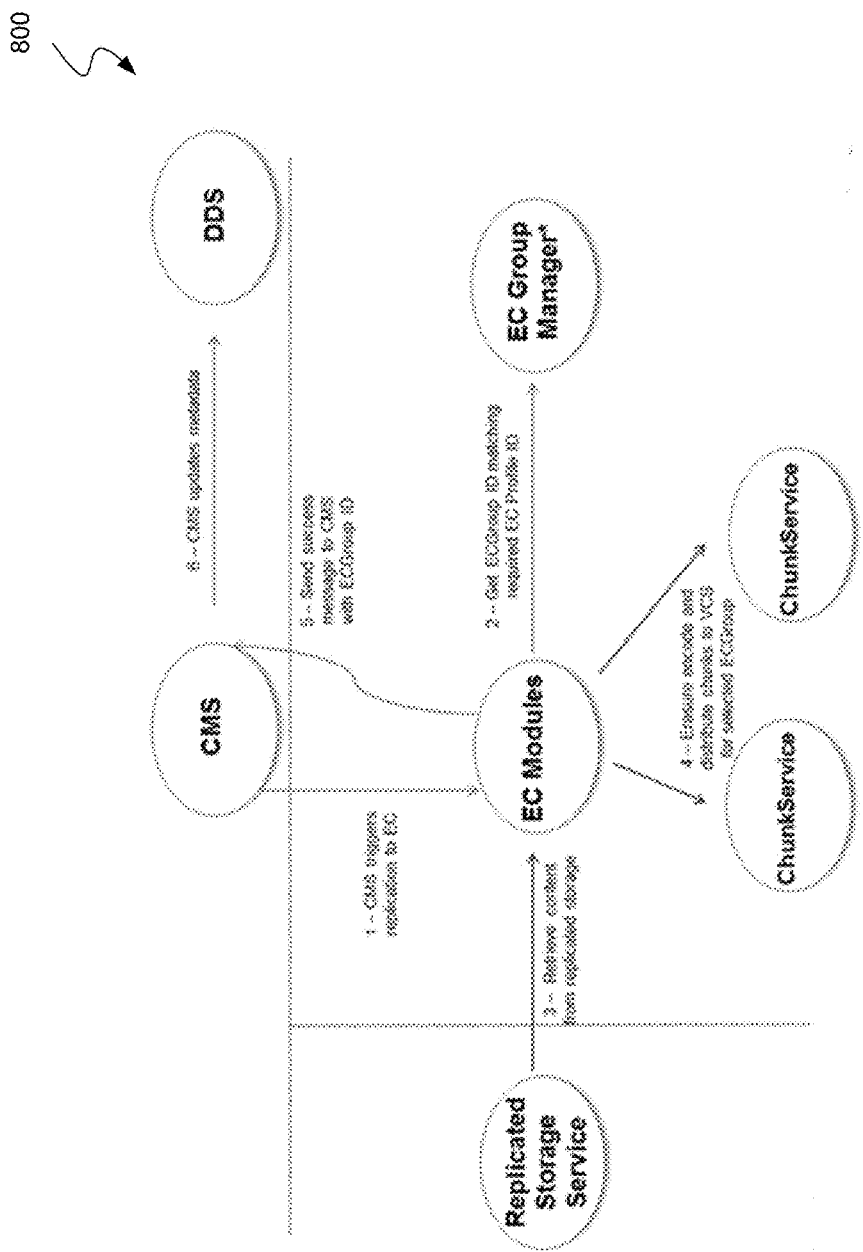
FIG. 8 is a flow diagram of a process for writing a data object to the distributed storage of FIG. 1, consistent with various embodiments.

FIG. 8 is a flow diagram of a process 800 for writing a data object to the distributed storage of FIG. 1, consistent with various embodiments. In some embodiments, the process 800 can be implemented in the environment 100 of FIG. 1 and using the data management system 110. At step 1, a content management service (CMS) module 805 associated with the data management system 110 initiates a write operation for a data object, e.g., data object 305. In some embodiments, the CMS module 805 directs placement of objects into the distributed data storage system. In some embodiments, the CMS module 805 can include information regarding the grouping scheme to be applied to the data object. In some embodiments, the grouping scheme may be determined by the CMS module 805 based on a type of application issuing the write request, a type of the data object, etc. In some embodiments, the grouping scheme can be defined by a user, e.g., an administrator of the data management system 110, and stored in the form of a data protection policy. At step 2, an EC module 810 associated with the data management system 110 obtains, e.g., from an EC group manager 815, an ECG that satisfies the provided grouping scheme, e.g., "ECG1". In some embodiments, the EC group manager 815 generates the ECGs, e.g., ECGs 610, based on the grouping scheme. At step 3, the EC module 810 retrieves the data object, e.g., from a replication storage service, from one or more sources where the data object is stored, e.g., the data object 305 to be erasure coded.

At step 4, the EC module 810 erasure codes the data object, e., based on a erasure coding scheme to generate the EC fragments, e.g., EC fragments 310, and transmits the EC fragments to the VCSs of the selected ECG. The chunk service on the storage nodes that are part of the selected ECG receives the VCSs and stores at them at the persistent storage medium associated with the storage nodes. At step 5, upon successful writing of the EC fragments to the VCSs, the EC module 810 can send a success message to the CMS module 805. In some embodiments, the EC module 810 also provides the IDs of the VCSs where the data object fragments are stored to the CMS module 805, e.g., as part of the success message. At step 6, the CMS module 805 provides the VCSs and/or the ECG information of the data object to a metadata service, e.g., a distributed data service (DDS) module 820, to update the metadata, e.g., in a metadata store. The metadata can include the IDs of the VCSs and/or the ECG where the data object fragments are stored. In some embodiments, the CMS module 805 can update the metadata of the data object in the metadata store without using the DDS module 820.

Figure 9:
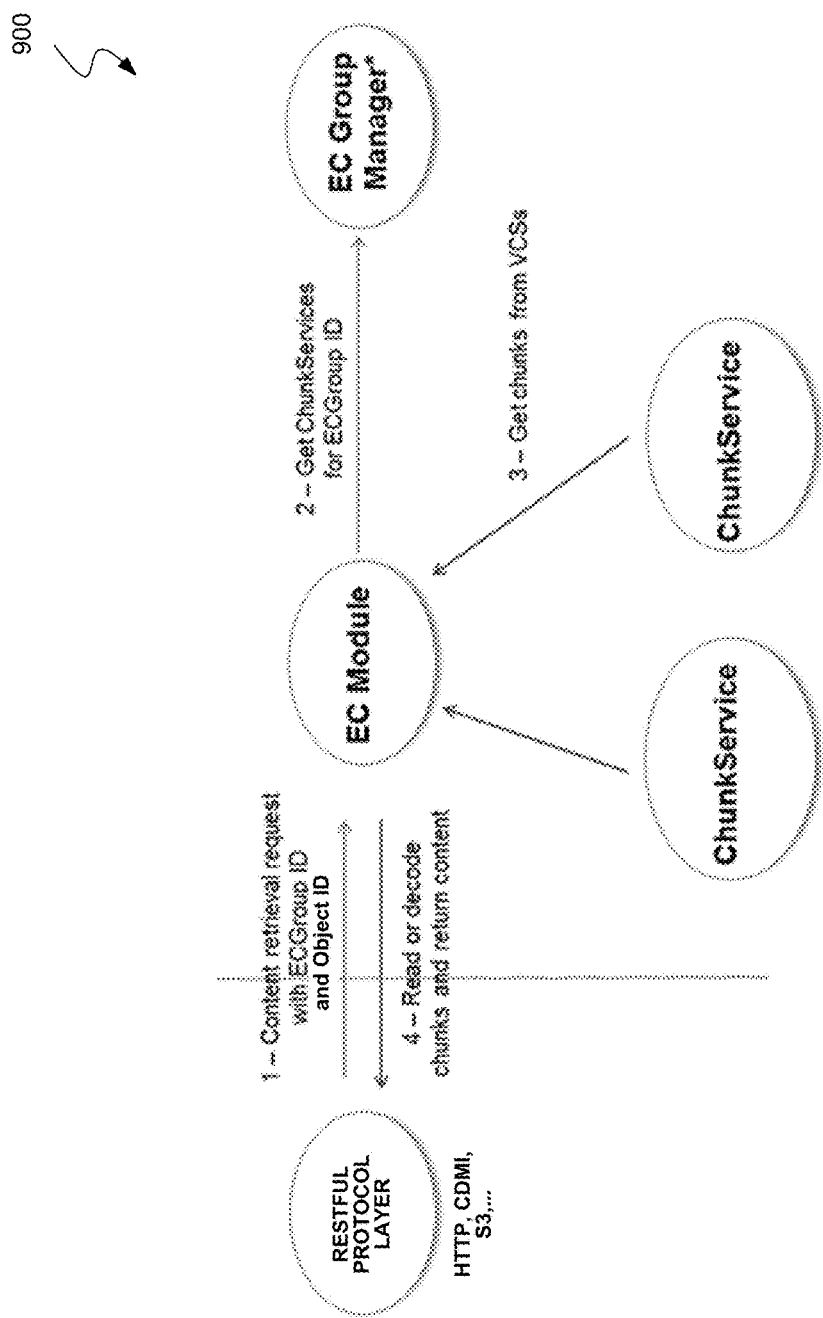
FIG. 9 is a flow diagram of a process for reading data from the distributed storage of FIG. 1, consistent with various embodiments.

FIG. 9 is a flow diagram of a process 900 for reading data from the distributed storage of FIG. 1, consistent with various embodiments. In some embodiments, the process 900 may be implemented in environment 100 of FIG. 1. At step 1, the EC module 810 receives a read request from a requesting entity for retrieving a data object. In some embodiments, the read request includes the object ID of the data object and/or the ECG ID of the ECG to which the data object is assigned. In some embodiments, the requesting entity can be a client computer ("client") which sends the read and/or write request using one or more protocols, e.g., hyper-text transfer protocol (HTTP).

At step 2, the EC module 810 obtains the IDs of the VCSs in which the data object is stored, e.g., from the EC group manager 815. In some embodiments, the EC group manager 815 uses the DDS module 820 to obtain the VCSs storing the data object. The DDS module 820 can identify the VCSs in which the data object is stored by searching the ECG→VCS mapping and/or the VCS→object mapping metadata using the object ID and any ECG ID provided in the request.

After identifying the VCSs, at step 3, the EC module 810 obtains all or a subset of the data fragments of the data object from the identified VCSs. At step 4, the EC module 810 decodes the data fragments, e.g., based on the erasure coding scheme used to encode the data object, to reconstruct the data object, and returns the reconstructed data object to the requesting entity.

Note that the data management system 110 can include additional modules or lesser number of modules than illustrated in FIGS. 8 and 9. For example, the additional modules can perform other functionalities than described above. In another example, the functionalities of one or more of the above modules can be split into two or more additional modules. Further, functionalities of two or more modules can be combined into one module.

Figure 10:
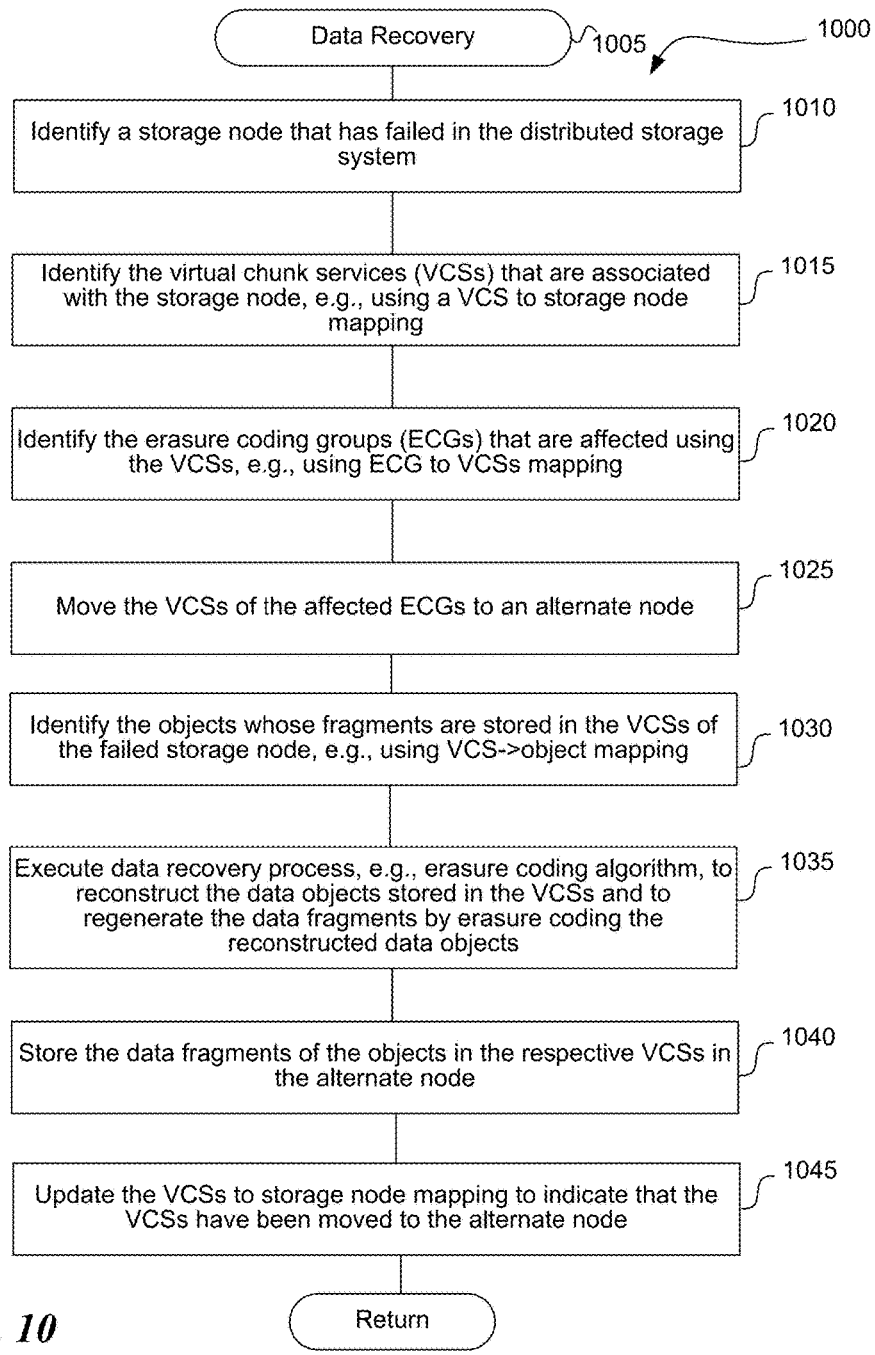
FIG. 10 is a flow diagram of a process for recovering lost data in the distributed storage of FIG. 1, consistent with various embodiments.

FIG. 10 is a flow diagram of a process 1000 for recovering lost data in the distributed storage of FIG. 1, consistent with various embodiments. In some embodiments, the process 1000 may be implemented in environment 100 of FIG. 1.

The data in the distributed storage 150 can be lost due to various reasons, e.g., failure of a storage node, failure of a portion of the storage node, failure of a site. For the sake of convenience, the data recovery process 1000 is described with respect to data loss due to a failure of a storage node in the distributed storage 150. However, the process 1000 can be implemented for other types of data losses as well. The process 1000 begins at block 1005, and at block 1010, the EC module 810 identifies a storage node that has failed in the distributed storage 150 ("failed storage node").

At block 1015, the EC module 810 identifies the VCSs that are associated with the failed storage node using the metadata. For example, the EC module 810 requests the DDS module 820 to obtain the IDs of the VCSs associated with failed storage node, and the DDS module 820 uses the metadata, e.g., VCS to storage node mapping described above, to obtain the VCS IDs.

At block 1020, the EC module 810 identifies the ECGs that are effected due to storage node failure. In some embodiments, the EC module 810 requests the DDS module 820 to obtain the IDs of the ECG associated with the storage node. The DDS module 820 can use the IDs of the VCSs identified in the block 1015 to identify the effected ECGs, e.g., based on the ECG to VCS mapping metadata.

At block 1025, the EC module 810 reassigns the VCSs of the effected ECGs to an alternate node(s). In some embodiments, reassigning the VCSs to the alternate node can include reassigning the VCSs on the failed storage node to the alternate node such that this reassignment continues to satisfy the data protection requirements of the ECG. These reassigned VCSs can start off empty until data fragments that belonged to them before the storage node failure are regenerated, e.g., as described in block 1035.

At block 1030, the EC module 810 identifies the objects whose fragments are stored in the VCSs (and/or ECGs) of the failed storage node, e.g., using the VCS→object mapping metadata and/or ECG→object mapping metadata. Recall, e.g., from FIG. 8, that when the data object is stored in the distributed storage 150, the object metadata is updated to indicate the VCSs in which the fragments of the data object are stored.

After identifying the data objects whose fragments are stored in the effected VCSs, at block 1035, the EC module 810 executes a data recovery process. The data recovery process can include executing erasure coding algorithm on the data object fragments stored in the VCSs to reconstruct the data objects and then to regenerate the data fragments by erasure coding the reconstructed data objects.

At block 1040, the EC module 810 stores the data fragments of the data objects in the respective VCSs in the alternate node.

At block 1045, the DDS module 820 can update the VCSs to storage node mapping to indicate that the VCSs have been moved to the alternate node, and the process 1000 returns. In some embodiments, the EC module 810 can send a success message to the CMS module 805 along with one or more of object ID, VCS ID and storage node ID. The CMS module 805 can then instruct the DDS module 820 to update the VCSs to storage node mapping accordingly.

Referring back to blocks 1035 and 1040, in some embodiments, the data management system 110 can reconstruct all the data objects stored in the effected ECGs by one ECG at a time and one stripe of a data object at a time. The reconstructed stripes can be erasure encoded to regenerate data fragments belonging to the VCSs that were reassigned in block 1025 after the storage node failure. In some embodiments, the blocks 1035 and 1040 are executed serially for each stripe of every ECG to be repaired.

The data recovery process described above may not have to update the metadata of the impacted data objects as the fragments of those data objects are still stored in the same VCSs as before the failure; only the VCS-storage node mapping may need to be updated as the VCSs are moved to the alternate node. Therefore, by eliminating the need to update the metadata of all the impacted data objects, the VCS based storage technique minimizes the computing resources consumed for updating the metadata, thereby improving the efficiency of a data recovery process. Further, since the data objects stored on the failed node can be identified using the VCS→storage node mapping and VCS→data objects mapping, the process can eliminate the need to read the metadata of all the data objects to determine if a fragment of the data object is stored in the failed node, thereby saving the computing resources required for performing the read operation.

Figure 11:
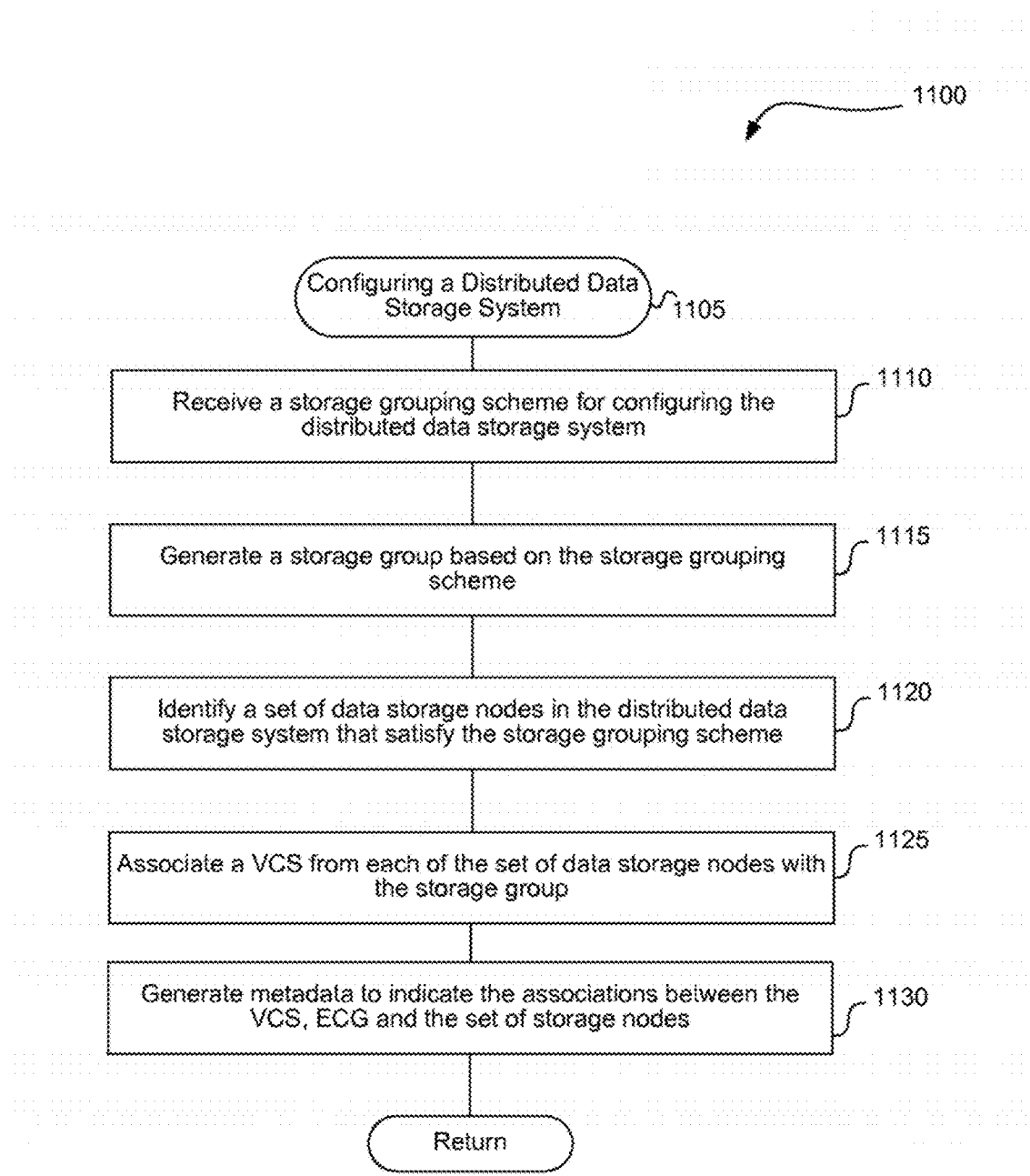
FIG. 11 is a flow diagram of a process for configuring a VCS storage layout of the distributed storage of FIG. 1, consistent with various embodiments.

FIG. 11 is a flow diagram of a process 1100 for configuring a VCS storage layout of the distributed storage of FIG. 1, consistent with various embodiments. In some embodiments, the process 1100 may be implemented in environment 100 of FIG. 1. The process 1100 begins at block 1105, and at block 1110, the EC group manager 815 receives a storage grouping scheme, e.g., grouping scheme 505, for configuring the distributed storage 150. In some embodiments, the grouping scheme 505 can include information regarding storage nodes, e.g., the storage sites to be selected for a storage group, the number of storage nodes to be selected and the number of storage nodes to be selected from a storage site. In some embodiments, the grouping scheme define the selection of the storage sites and/or nodes based on an erasure coding scheme to be used. For example, the grouping scheme 505 indicates that for a "2+1" erasure coding scheme, a storage pool is to be created by selecting a node from each of the sites A, B and C, which means that an object erasure coded using "2+1" erasure coding scheme is to be stored at the selected nodes in sites A, B and C. The data management system 110 can facilitate defining a number of grouping schemes.

At block 1115, the EC group manager 815 generates a storage group, e.g., "ECG 1" based on the storage grouping scheme, and assigns a unique ID to the storage group.

At block 1120, the EC group manager 815 identifies a set of the nodes in the distributed storage 150 that satisfy the grouping scheme.

At block 1125, the EC group manager 815 associates a VCS from each of the identified nodes with the storage group.

At block 1130, the DDS module 820 generates various metadata indicating the associations between the VCS, storage group and the nodes, and the process 1100 returns. For example, the DDS module 820 generates an ECG→VCS mapping metadata that indicates the VCSs associated with a particular storage group. In some embodiments, the DDS module 820 generates a VCS→node mapping metadata when a storage node is deployed into the distributed storage 150 and the chunk service splits the storage node into VCSs.

Figure 12:
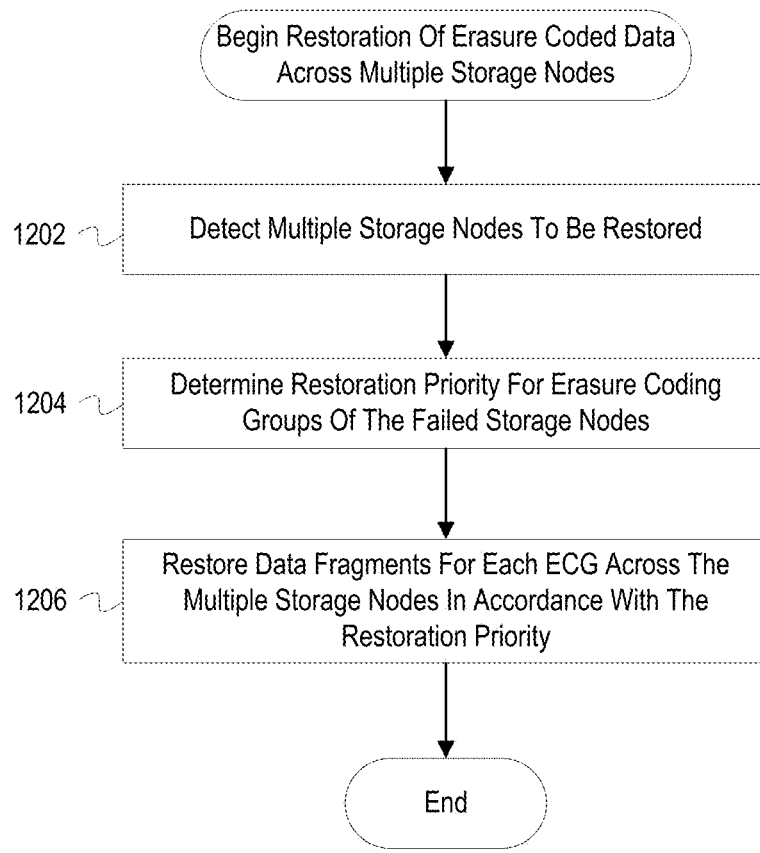
FIG. 12 depicts a flowchart with example operations for restoring erasure coded data across multiple storage nodes.

FIG. 12 depicts a flowchart with example operations for restoring erasure coded data across multiple storage nodes. FIG. 12 describes a storage node as performing the operations, although the operations may be performed by other components or software processes.

At block 1202, a storage node ("node") detects multiple storage nodes to be restored. The node may be an ECG manager which monitors the health of ECGs, or the node may be a storage controller that monitors storage nodes in a storage system and manages recovery of the storage nodes. The node may first detect the failure of the multiple storage nodes based on the storage nodes not responding to read/write requests, not responding to polling messages, detecting a network failure, etc. In some instances, such as the example described in FIG. 1, storage nodes may be geographically distributed and be unreachable due to a data center failure. Once the multiple storage nodes are repaired, the node initiates a recovery process to efficiently restore lost data fragments to the multiple storage nodes as described below. The node may initiate the recovery process based on instructions received from an administrator via a management interface.

At block 1204, the node determines restoration priority for ECGs of the failed storage nodes. The node identifies effected ECGs using the ECG to storage node mappings in metadata as described above. The restoration priority is based on the number of VCSs lost for each ECG. For example, a first ECG which lost 3 VCSs has a higher restoration priority than a second ECG which lost 2 VCSs. The higher the number of lost VCSs in an ECG the closer the ECG is to being unable to be restored. As a result, the ECGs with the most lost VCSs are restored first.

At block 1206, the node restores data fragments for each ECG across the multiple storage nodes in accordance with the restoration priority. The node reads data fragments from operational storage nodes of the ECG being restored. The node determines a number of data fragments to read based on an EC scheme used by an ECG. For example, if an ECG uses a 6+3 scheme, the node reads six data fragments. The EC scheme, and therefore the number of data fragments to be read, can vary based on the ECG being restored.

After reading the data fragments, the node uses the read data fragments to regenerate the lost data fragments. The node can use the VCS to storage node and VCS to ECG mappings as described above to determine how many data fragments in the ECG were lost. The node also determines which failed storage nodes correspond to the ECG. The node then generates new data fragments and stores the new data fragments on the corresponding failed storage nodes. In instances where an ECG has multiple VCSs on a storage node, the node restores data fragments for each VCS in the ECG. To reduce the number of read requests and preserve bandwidth, the node restores all lost data fragments for an ECG prior to deleting or freeing up the read data fragments for the ECG. By ensuring that the ECG is repaired across the storage nodes prior to deleting the read data fragments, the node ensures that the data fragments will not need to be read again throughout the rest of the restoration process.

In some instances, elements of the FIG. 10 are utilized during the restoration process. For example, if a failed storage node is replaced rather than repaired, the node may update the VCSs to storage node mapping to indicate that the VCSs have been moved to the alternate node as described in block 1045. This updating of the metadata can occur for each storage node during the recovery of an ECG across multiple storage nodes.

Figure 13:
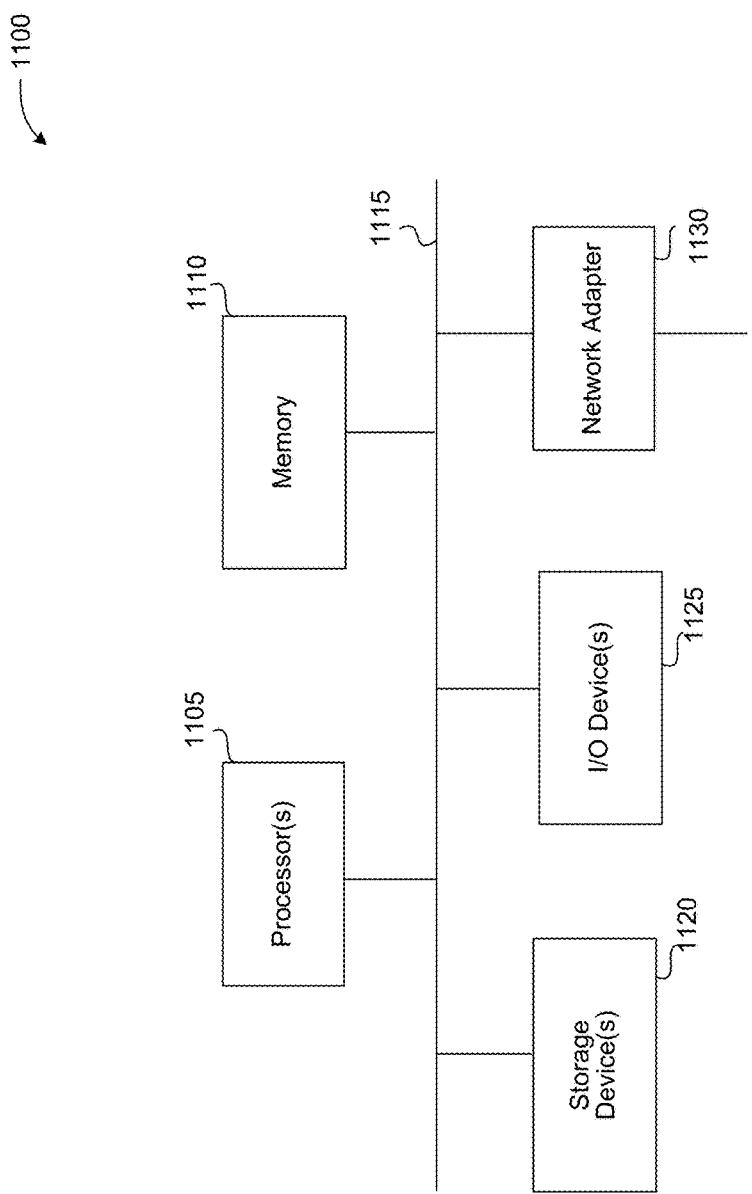
FIG. 13 is a block diagram of a computer system as may be used to implement features of some embodiments of the disclosed technology.

FIG. 13 is a block diagram of a computer system as may be used to implement features of some embodiments of the disclosed technology. The computing system 1300 may be used to implement any of the entities, components or services depicted in the examples of the foregoing figures (and any other components described in this specification). The computing system 1300 may include one or more central processing units ("processors") 1305, memory 1310, input/output devices 1325 (e.g., keyboard and pointing devices, display devices), storage devices 1320 (e.g., disk drives), and network adapters 1330 (e.g., network interfaces) that are connected to an interconnect 1315. The interconnect 1315 is illustrated as an abstraction that represents any one or more separate physical buses, point to point connections, or both connected by appropriate bridges, adapters, or controllers. The interconnect 1315, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 1310 and storage devices 1320 are computer-readable storage media that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection. Thus, computer-readable media can include computer-readable storage media (e.g., "non-transitory" media) and computer-readable transmission media.

The instructions stored in memory 1310 can be implemented as software and/or firmware to program the processor(s) 1305 to carry out actions described above. In some embodiments, such software or firmware may be initially provided to the computing system 1300 by downloading it from a remote system through the computing system 1300 (e.g., via network adapter 1330).

The technology introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Variations

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for periodically performing an ECGM election process among available storage nodes as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method comprising:
based on detecting a set of storage nodes to be restored in an erasure coded storage system, identifying erasure coding groups affected by data loss on the set of storage nodes;
for each of the erasure coding groups,
reading data fragments from a plurality of active storage nodes in the erasure coding group;
generating new data fragments to replace lost data fragments based, at least in part, on the read data fragments; and
restoring one of the new data fragments to each storage node in the set of storage nodes.

2. The method of claim 1 further comprising:
determining for each erasure coding group in the erasure coding groups a number of data fragments lost; and
prioritizing restoration of the erasure coding groups based, at least in part, on the number of data fragments lost for each erasure coding group.

3. The method of claim 2, wherein prioritizing restoration of the erasure coding groups based, at least in part, on the number of data fragments lost for each erasure coding group comprises:
identifying a first erasure coding group which lost a largest number of data fragments; and
generating new data fragments for the first erasure coding group prior to other erasure coding groups in the erasure coding groups.

4. The method of claim 1, wherein identifying erasure coding groups affected by data loss on the set of storage nodes comprises identifying erasure coding groups that are mapped to storage nodes in the set of storage nodes in metadata of the erasure coded storage system.

5. The method of claim 1, wherein reading data fragments from a plurality of active storage nodes in the erasure coding group comprises:
determining an erasure coding scheme for the erasure coding group; and
reading a minimum number of data fragments need to generate the new data fragments based, at least in part, on the erasure coding scheme.

6. The method of claim 1 further comprising:
for each of the erasure coding groups,
determining that the erasure coding group has been repaired across the set of storage nodes prior to deleting the read data fragments.

7. The method of claim 1, wherein restoring one of the new data fragments to each storage node in the set of storage nodes comprises:
writing a new data fragment to a first storage node in the set of storage nodes; and
updating metadata of the erasure coded storage system to indicate that the new data fragment is stored on the first storage node.

8. One or more non-transitory machine-readable storage media comprising program code for concurrently restoring erasure coded data to multiple storage nodes, the program code to:
based on detection of a set of storage nodes to be restored in an erasure coded storage system, identify erasure coding groups affected by data loss on the set of storage nodes;
for each of the erasure coding groups,
read data fragments from a plurality of active storage nodes in the erasure coding group;
generate new data fragments to replace lost data fragments based, at least in part, on the read data fragments; and
restore one of the new data fragments to each storage node in the set of storage nodes.

9. The machine-readable storage media of claim 8 further comprising program code to:
determine for each erasure coding group in the erasure coding groups a number of data fragments lost; and
prioritize restoration of the erasure coding groups based, at least in part, on the number of data fragments lost for each erasure coding group.

10. The machine-readable storage media of claim 9, wherein the program code to prioritize restoration of the erasure coding groups based, at least in part, on the number of data fragments lost for each erasure coding group comprises program code to:
identify a first erasure coding group which lost a largest number of data fragments; and
generate new data fragments for the first erasure coding group prior to other erasure coding groups in the erasure coding groups.

11. The machine-readable storage media of claim 8, wherein the program code to identify erasure coding groups affected by data loss on the set of storage nodes comprises program code to identify erasure coding groups that are mapped to storage nodes in the set of storage nodes in metadata of the erasure coded storage system.

12. The machine-readable storage media of claim 8, wherein the program code to read data fragments from a plurality of active storage nodes in the erasure coding group comprises program code to:
determine an erasure coding scheme for the erasure coding group; and
read a minimum number of data fragments need to generate the new data fragments based, at least in part, on the erasure coding scheme.

13. The machine-readable storage media of claim 8, wherein the program code to restore one of the new data fragments to each storage node in the set of storage nodes comprises program code to:
write a new data fragment to a first storage node in the set of storage nodes; and
update metadata of the erasure coded storage system to indicate that the new data fragment is stored on the first storage node.

14. An apparatus comprising:
a processor; and
a non-transitory machine-readable storage medium having program code executable by the processor to cause the apparatus to,
based on detection of a set of storage nodes to be restored in an erasure coded storage system, identify erasure coding groups affected by data loss on the set of storage nodes;
for each of the erasure coding groups,
read data fragments from a plurality of active storage nodes in the erasure coding group;

generate new data fragments to replace lost data fragments based, at least in part, on the read data fragments; and restore one of the new data fragments to each storage node in the set of storage nodes.

15. The apparatus of claim 14 further comprising program code executable by the processor to cause the apparatus to:
   determine for each erasure coding group in the erasure coding groups a number of data fragments lost; and
   prioritize restoration of the erasure coding groups based, at least in part, on the number of data fragments lost for each erasure coding group.

16. The apparatus of claim 15, wherein the program code executable by the processor to cause the apparatus to prioritize restoration of the erasure coding groups based, at least in part, on the number of data fragments lost for each erasure coding group comprises program code executable by the processor to cause the apparatus to:
   identify a first erasure coding group which lost a largest number of data fragments; and
   generate new data fragments for the first erasure coding group prior to other erasure coding groups in the erasure coding groups.

17. The apparatus of claim 14, wherein the program code executable by the processor to cause the apparatus to identify erasure coding groups affected by data loss on the set of storage nodes comprises program code executable by the processor to cause the apparatus to identify erasure coding groups that are mapped to storage nodes in the set of storage nodes in metadata of the erasure coded storage system.

18. The apparatus of claim 14, wherein the program code executable by the processor to cause the apparatus to read data fragments from a plurality of active storage nodes in the erasure coding group comprises program code executable by the processor to cause the apparatus to:
   determine an erasure coding scheme for the erasure coding group; and
   read a minimum number of data fragments need to generate the new data fragments based, at least in part, on the erasure coding scheme.

19. The apparatus of claim 14 further comprising program code executable by the processor to cause the apparatus to:
   for each of the erasure coding groups,
      determine that the erasure coding group has been repaired across the set of storage nodes prior to deleting the read data fragments.

20. The apparatus of claim 14, wherein the program code executable by the processor to cause the apparatus to restore one of the new data fragments to each storage node in the set of storage nodes comprises program code executable by the processor to cause the apparatus to:
   write a new data fragment to a first storage node in the set of storage nodes; and
   update metadata of the erasure coded storage system to indicate that the new data fragment is stored on the first storage node.

* * * * *